(12) United States Patent
Choi

(10) Patent No.: US 7,508,427 B2
(45) Date of Patent: Mar. 24, 2009

(54) APPARATUS AND METHOD FOR AMPLIFYING ANALOG SIGNAL AND ANALOG PREPROCESSING CIRCUITS AND IMAGE PICK-UP CIRCUITS

(75) Inventor: Hee-Cheol Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 723 days.

(21) Appl. No.: 10/823,859

(22) Filed: Apr. 14, 2004

(65) Prior Publication Data

US 2005/0018061 A1 Jan. 27, 2005

(30) Foreign Application Priority Data

Jul. 25, 2003 (KR) .................... 10-2003-0051552

(51) Int. Cl.
*H04N 5/217* (2006.01)
(52) U.S. Cl. ..................................... 348/241
(58) Field of Classification Search .......... 348/241–251
See application file for complete search history.

(56) References Cited

U.S. PATENT DOCUMENTS

| | | | | |
|---|---|---|---|---|
| 6,388,500 B1 * | 5/2002 | Lee et al. | ..................... | 327/337 |
| 6,499,663 B1 | 12/2002 | Yahagi et al. | .......... | 235/462.28 |
| 6,529,237 B1 | 3/2003 | Tsay et al. | .................. | 348/241 |
| 6,563,364 B2 * | 5/2003 | Lee et al. | ..................... | 327/337 |
| 6,650,364 B1 * | 11/2003 | Itani et al. | ................ | 348/229.1 |
| 6,720,999 B1 * | 4/2004 | Holberg et al. | ........... | 348/222.1 |
| 6,757,018 B1 * | 6/2004 | Fowler | ........................ | 348/301 |
| 6,838,787 B2 * | 1/2005 | Parks | ......................... | 307/109 |
| 6,853,241 B2 * | 2/2005 | Fujimoto | ........................ | 330/9 |
| 7,038,720 B2 * | 5/2006 | Rogers et al. | ............... | 348/241 |
| 2002/0033891 A1 | 3/2002 | Ying et al. | ................... | 348/241 |
| 2002/0176009 A1 | 11/2002 | Johnson et al. | ............. | 348/229 |

FOREIGN PATENT DOCUMENTS

| | | |
|---|---|---|
| EP | 0991274 | 4/2002 |
| JP | 2002-158585 | 5/2002 |
| KR | 02-60421 | 7/2002 |

* cited by examiner

*Primary Examiner*—Justin P Misleh
(74) *Attorney, Agent, or Firm*—Mills & Onello LLP

(57) ABSTRACT

A system and method for processing an input signal, such as an analog video input signal, are described. The system includes a correlated double sampler (CDS) for receiving an input signal, sampling the input signal and providing an output signal, the CDS comprising an amplifier for amplifying the input signal. The sampled and amplified output of the CDS is applied to a programmable gain amplifier (PGA). The PGA receives the output signal from the CDS and amplifies the received signal. By providing gain in both the CDS and the PGA, the system of the invention uses much smaller area than conventional systems. Also, a pseudo log scale gain response for the overall system is realized.

27 Claims, 11 Drawing Sheets

FIG. 10

| Gain bits | | Gain A x B | | DC Gain [V/V] | DC Gain dB |
|---|---|---|---|---|---|
| PGA[7:6] | PGA[5:0] | A | B | | |
| 00 | 00 0000 | 0.5C/1.0C | 128C/127C | 0.504 | -5.95dB |
| 00 | 00 0001 | 0.5C/1.0C | 128C/126C | 0.507 | -5.88dB |
| 00 | 00 0010 | 0.5C/1.0C | 128C/125C | 0.512 | -5.81dB |
| ... | ... | ... | ... | ... | ... |
| 00 | 11 1110 | 0.5C/1.0C | 128C/65C | 0.985 | -0.13dB |
| 00 | 11 1111 | 0.5C/1.0C | 128C/64C | 1.000 | 0.00dB |
| 01 | 00 0000 | 1.0C/1.0C | 128C/127C | 1.008 | 0.07dB |
| 01 | 00 0001 | 1.0C/1.0C | 128C/126C | 1.016 | 0.14dB |
| 01 | 00 0010 | 1.0C/1.0C | | 1.024 | 0.21dB |
| ... | ... | ... | ... | ... | ... |
| 01 | 11 1111 | 1.0C/1.0C | 128C/64C | 2.000 | 6.02dB |
| 10 | 00 0000 | 2.0C/1.0C | 128C/127C | 2.016 | 6.09dB |
| 10 | 00 0001 | 2.0C/1.0C | 128C/126C | 2.032 | 6.16dB |
| ... | ... | ... | ... | ... | |
| 10 | 11 1111 | 2.0C/1.0C | 128C/64C | 4.000 | 12.04dB |
| 11 | 00 0000 | 4.0C/1.0C | 128C/127C | 4.031 | 12.11dB |
| 11 | 00 0001 | 4.0C/1.0C | 128C/126C | 4.063 | 12.18dB |
| ... | ... | ... | ... | ... | ... |
| 11 | 11 1111 | 4.0C/1.0C | 128C/64C | 8.000 | 18.06dB |

APPARATUS AND METHOD FOR AMPLIFYING ANALOG SIGNAL AND ANALOG PREPROCESSING CIRCUITS AND IMAGE PICK-UP CIRCUITS

RELATED APPLICATION

This application relies for priority on Korean patent application number 03-51552, filed on Jul. 25, 2003, the contents of which are incorporated herein in their entirety by reference.

FIELD OF THE INVENTION

The invention relates to image processing and, more particularly, to an analog front end (AFE) for a scanner, multifunction periphery (MFP), digital still camera (DSC) and/or a camcorder.

BACKGROUND OF THE INVENTION

A conventional image processing system includes a charge-coupled device (CCD), an analog front end (AFE) and a digital image processor. The AFE interfaces between an analog device, e.g., CCD, and a digital device and functions to convert the analog data from the analog device to digital data for the digital device.

FIG. 1 is a conceptual block diagram illustrating an image processing system. An image of an object 110 is formed by an image forming element, depicted as a lens 120, onto an analog image detecting device such as a CCD 130. The AFE 140 converts the analog data from the CCD to digital data and forwards the converted digital data to a digital post processor 150, which processes the data to be transmitted to one or more data/display devices, such as computer 170-A, storage disk 170-B, printer/facsimile machine 170-C or camcorder 170-D.

The analog device used for acquiring the analog data for the image can be referred to as a sensor. The sensor can be a contact image sensor (CIS) in which the object is in contact with the system, such as a piece of paper on the glass of a copy machine, facsimile machine or scanner. The CIS can be a CCD CIS or a CMOS CIS.

FIG. 2 is a schematic block diagram of one example of an AFE 140 in an image processing system. The AFE 140 can be regarded as including two parts, namely, the analog signal processing section and the digitizer. The analog signal processing section includes a correlated double sampler (CDS) 141 and a programmable gain amplifier (PGA) 142. The digitizer can include an analog-to-digital converter (ADC) 143. The CDS 141 receives the input analog image signal via an input terminal 144 and samples the input signal. The PGA 142 receives the sampled signals from the CDS 141, amplifies the samples using a variable gain and provides an output signal to the ADC 143. The ADC 143 digitizes the signal from the PGA 142 and provides the digital output at an output terminal 145.

FIG. 3 is a waveform diagram illustrating a typical input analog image signal. With reference to FIG. 3, for each pixel, the signal includes a reset portion, a black portion or reference portion and a signal portion as shown. The real signal or data portion of the signal extends between the dashed lines in the waveform diagram at points labeled 1 and 2.

At points 1 and 2, the CDS 141 samples the data signal. The CDS 141 subtracts the data signal from a reference signal, i.e., the black signal. The difference of the sampled data is a real signal.

With reference to FIG. 3, it is noted that the signal levels, and, in particular, the black reference signal, vary from pixel to pixel. This is due to different characteristics of the diodes in the pixels.

SUMMARY OF THE INVENTION

In one aspect, the invention is directed to an image processing system and method. In accordance with the invention, an input receives an input signal. A correlated double sampler (CDS) receives the input signal, samples the input signal and provides an output signal. The CDS of the invention includes an amplifier for amplifying the input signal.

In one embodiment, gain in the CDS is settable to one of a plurality of levels. In one particular embodiment, the gain in the CDS is settable to one of four levels. In one embodiment, the four levels comprise 0.5, 1.0, 2.0 and 4.0.

The gain in the CDS can be settable to a level between 1.0 and 2.0.

The gain in the CDS is settable by a digital input signal. The digital input signal can contain a plurality of bits, and, in particular, can include two bits.

In one embodiment, the system includes a programmable gain amplifier (PGA) for receiving the output signal from the CDS and amplifying the received signal. The gain in the PGA can be settable to one of a plurality of levels. In particular, the gain in the PGA can be settable to one of four levels. The four levels can include 0.5, 1.0, 2.0 and 4.0.

The gain in the PGA can be settable to a level between 1.0 and 2.0.

In one embodiment, gain of the PGA is settable by a digital input signal. The digital input signal contains a plurality of bits. In one embodiment, a first portion of the bits is applied to the CDS to set the gain of the CDS and a second portion of the bits is applied to the PGA to set the gain in the PGA.

In one embodiment, an overall gain of the system comprises a combination of gain in the CDS and gain in the PGA. The overall gain can be pseudo-logarithmic.

In another aspect, the invention is directed to an image processing system and method. In accordance with the invention, a correlated double sampler (CDS) receives an input signal. The CDS samples the input signal and provides an output signal. The CDS includes an amplifier for amplifying the input signal. A programmable gain amplifier (PGA) receives the output signal from the CDS and amplifies the received signal.

In one embodiment, gain in the CDS is settable to one of a plurality of levels. In one particular embodiment, the gain in the CDS is settable to one of four levels. In one embodiment, the four levels comprise 0.5, 1.0, 2.0 and 4.0.

The gain in the CDS can be settable to a level between 1.0 and 2.0.

The gain in the PGA can be settable to one of a plurality of levels. In particular, the gain in the PGA can be settable to one of four levels. The four levels can include 0.5, 1.0, 2.0 and 4.0.

The gain in the PGA can be settable to a level between 1.0 and 2.0.

The gain in the CDS and the gain in the PGA are settable by a digital input signal. The digital input signal can contain a plurality of bits. In one embodiment, a first portion of the bits is applied to the CDS to set the gain of the CDS and a second portion of the bits is applied to the PGA to set the gain in the PGA.

In one embodiment, an overall gain of the system comprises a combination of gain in the CDS and gain in the PGA. The overall gain can be pseudo-logarithmic.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 10 is a table illustrating the gain in the CDS, the gain in the PGA and the overall DC gain for the gain setting values of the bits of the digital gain setting signal, in accordance with the invention.

DETAILED DESCRIPTION OF THE INVENTION

As noted above, the PGA provides the output data amplified by a variable gain. Amplification can be achieved using operational amplifiers with switched capacitors. In such circuits, gain is achieved using the capacitor ratio. Where standard capacitor ratio is relied upon, either very large or very small capacitors are required to achieve a wide range of variable gain.

There are multiple gain methods which can be used in a PGA. In a linear scale method, the capacitors used are extremely large. As a result, the drive capability of the operational amplifiers must be large, resulting in an overall larger sized system. That is, to increase the drive capability, the size of the CDS needs to be large. The large size can slow the system's performance. In a log scale approach, small size and high speed can be realized. However, in such systems, the capacitor ratio is not a fixed number. This can make the circuit difficult to implement. In a pseudo log scale approach, the circuit can be simplified by using unit capacitors.

Figure 4:
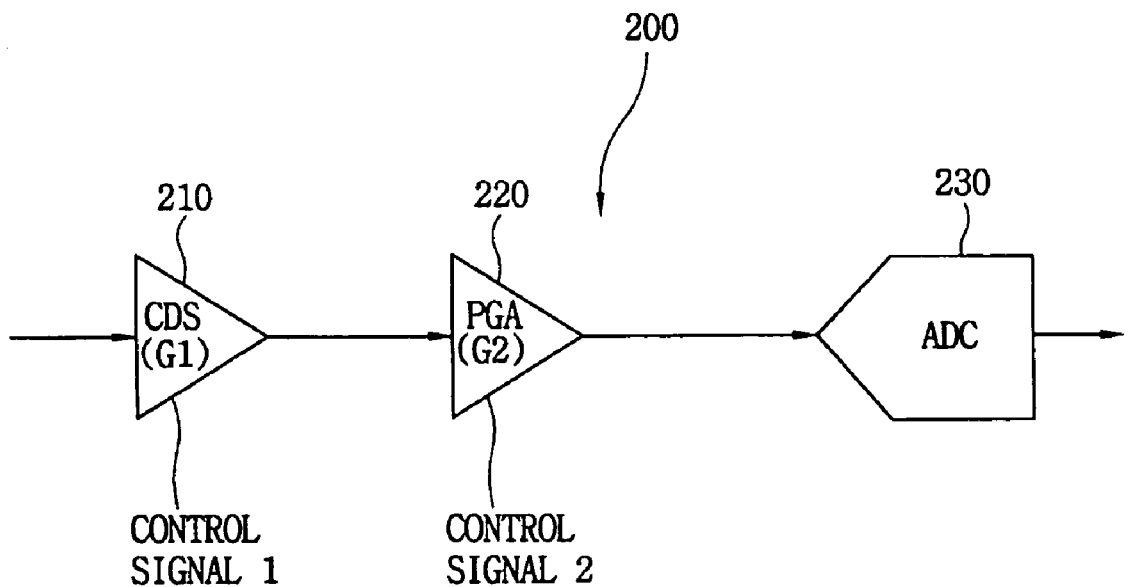
FIG. 4 is a schematic block diagram of a portion of the image processing system of the invention.

FIG. 4 is a schematic block diagram of a portion of the image processing system of the invention. Referring to FIG. 4, the system of the invention includes a CDS 210. The CDS 210 provides an output to a PGA 220, which provides an amplified output to the ADC 230. In accordance with the invention, both the PGA 220 and the CDS 210 have amplification gains. That is, the PGA 220 has a gain G2, and the CDS 210 has a gain G1. The gain G1 of the CDS 210 is controlled by a first input control signal, and the gain G2 of the PGA 220 is controlled by a second control signal. In one embodiment, as described in detail below, the system generates a digital input signal which is used to generate the two gain control signals. For example, the digital input signal can include a plurality of bits. A first portion of the bits can be used to control the gain G1 of the CDS 210, and a second portion of the bits can be used to control the gain G2 of the PGA 220.

In the system of the invention in FIG. 4, the overall gain of the system is formed as the combination of two portions. That is, the overall gain of the system is a combination of the gain G1 of the CDS 210 and the gain G2 of the PGA 220. The input signal is first amplified by the CDS 210, and is then amplified by the PGA 220. This results in decreased chip size and decreased noise. Also, the combination of the gains G1 and G2 results in an overall gain that is a pseudo log scale gain, as described below in detail.

Figure 5:
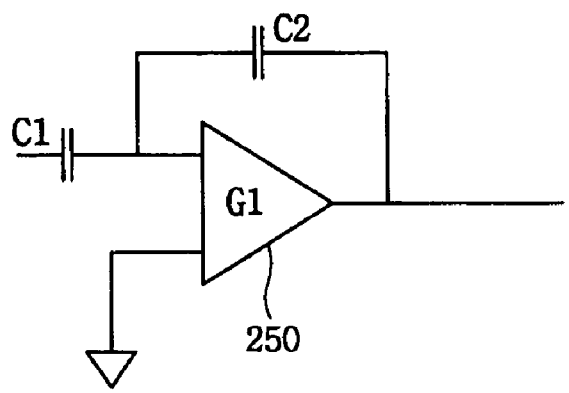
FIG. 5 is a schematic block diagram of an amplifier circuit using capacitors to set gain.

FIG. 5 is a schematic block diagram of an amplifier circuit using capacitors C1 and C2 to set gain. The amplifier circuit includes an operational amplifier 250 having first and second input terminals. A first capacitor C1 is connected between an input of the circuit and one of the input terminals of the operational amplifier 250. A second capacitor C2 is connected between the node at which C1 and the operational amplifier 250 are connected and the output of the operational amplifier 250. An input signal is applied at the input of the circuit at one of the terminals of the capacitor C1. The input signal is amplified according to a gain of the circuit. The amplified signal appears at the output of the operational amplifier 250.

The gain of the circuit is determined by the ratio of the capacitances of C1 and C2. That is, the gain $G1=C1/C2$. For example, if the capacitance of C1 is $128C0$ and the capacitance of C2 is $1C0$, the gain of the circuit is 128, where $C0$ is a unit capacitance.

Figure 6:
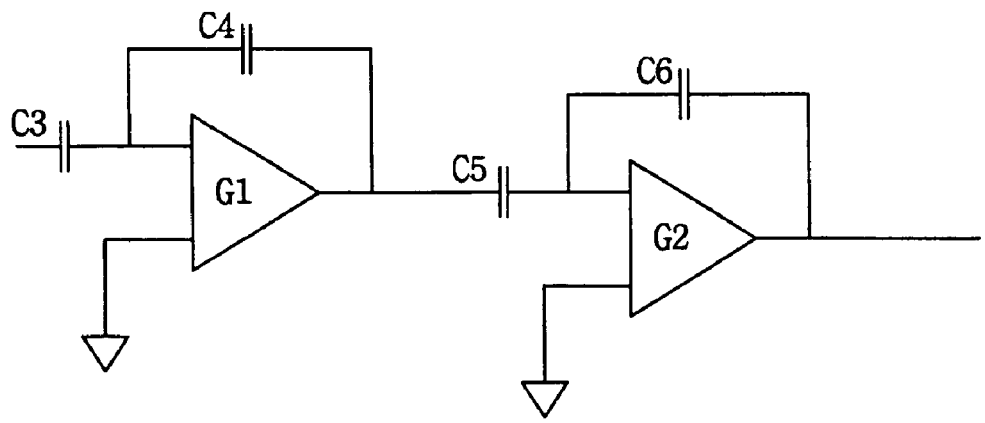
FIG. 6 is a schematic diagram illustrating amplification in an analog front end (AFE) in accordance with the present invention.

FIG. 6 is a schematic diagram illustrating amplification in an analog front end (AFE) in accordance with the present invention. The circuit of FIG. 6 includes amplification in the CDS and also amplification in the PGA. The gain of the CDS is referred to as G1, and the gain in the PGA is referred to as G2. The gains G1 and G2 are determined by capacitance ratios. Specifically, the gain G1 is determined by the ratio of capacitances C3 and C4, i.e., $G1=C3/C4$. The gain G2 is determined by the ratio of capacitances C5 and C6, i.e., $G2=C5/C6$. The overall or total gain $G_T$ of the system is the product of gains G1 and G2, i.e., $G_T=G1\times G2$.

For example, if $C3=4C0, C4=1C0, C5=32C0$ and $C6=1C0$, the gain G1 in the CDS is 4, and the gain G2 in the PGA is 32. The overall gain of the system is 128. The circuit area of the circuit of FIG. 6 is much less than that of the circuit of FIG. 5. That is, the circuit of FIG. 5 requires a higher total capacitance, i.e., $129C0$, than the circuit of FIG. 6, i.e., $38C0$. If capacitance occupies a certain capacitance unit area, then the total area occupied by C1 and C2 in FIG. 5 can be said to be 129 unit areas. In contrast, the total capacitance in FIG. 6 occupies 38 unit areas.

Figure 7:
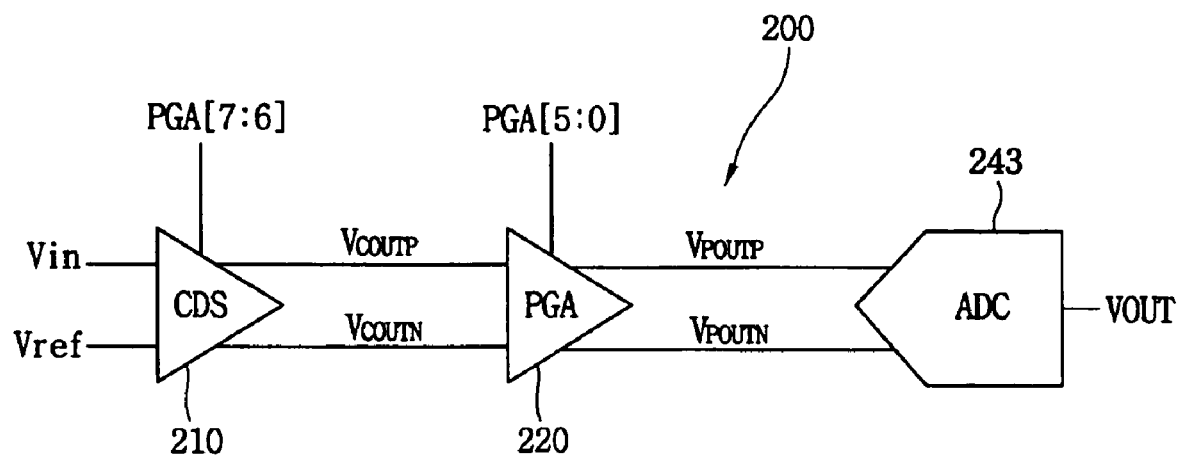
FIG. 7 is a schematic block diagram of one embodiment of an image processing system in accordance with the invention.

FIG. 7 is a schematic block diagram of the system 200 in accordance with the invention. As shown in FIG. 7 and described above, the system 200 includes a CDS 210 and a PGA 220. Both the CDS 210 and the PGA 220 include amplifiers for providing gain. As shown in FIG. 7, both the CDS 210 and the PGA 220 receive portions of a multiple-bit digital input signal PGA for setting their respective gains. In the particular exemplary embodiment of FIG. 7, the overall gain is set by an eight-bit digital signal PGA[7:0]. In this particular embodiment, two bits PGA[7:6] are applied to the CDS 210 and are used to set the gain in the CDS 210. The remaining six bits PGA[5:0] are applied to the PGA 220 to set its gain. The CDS 210 receives the input analog signal Vin and a reference voltage Vref. The CDS 210 samples and amplifies the signal Vin according to the gain set by the signal bits PGA[7:6] to produce output signals Vcoutp and Vcoutn, which are applied to the PGA 220. The PGA amplifies the received signals from the CDS 210 according to the gain set by the signal bits PGA[5:0] to produce output signals Vpoutp and Vpoutn, which are applied as inputs to the ADC 243. The ADC 243 digitizes the received signals and generates a digitized output signal Vout.

Hence, in accordance with the invention, the input signal is processed and amplified in both the CDS and PGA stages. The gains in both stages are settable by the multiple-bit digital signal PGA[7:0]. A first portion of the bits is applied to set the gain in the CDS 210, and a second portion of the bits is applied to set the gain in the PGA 220.

Figure 8:
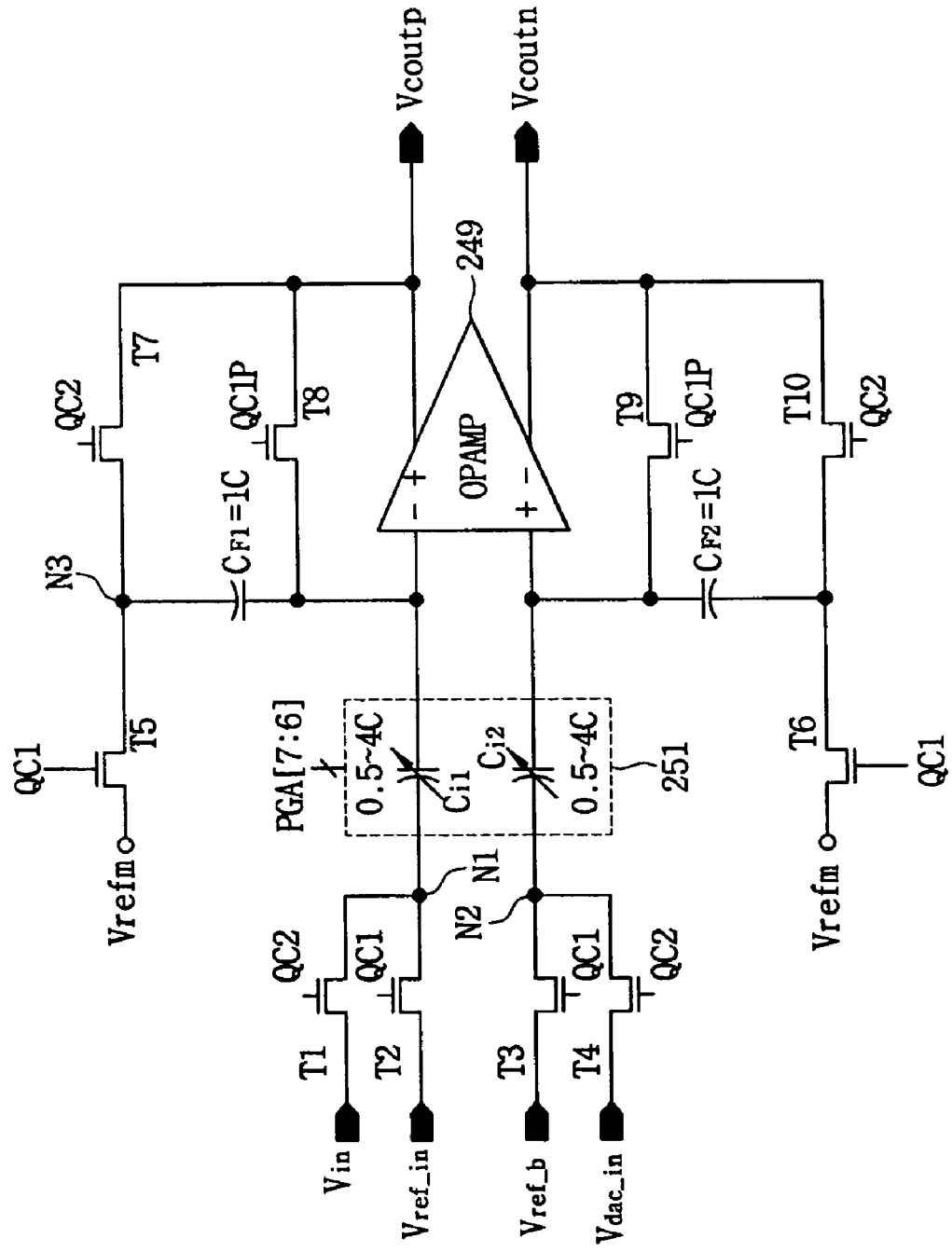
FIG. 8 is a schematic block diagram of one embodiment of a correlated double sampler (CDS) of the invention.

FIG. 8 is a schematic block diagram of one embodiment of the correlated double sampler (CDS) 210 of the invention. Referring to FIG. 8, the CDS 210 receives as inputs the input data signal Vin, a reference signal Vref_in, a reference signal Vref_b and a signal Vdac_in. The signal Vref_in provides the black level voltage for the input signal. The difference between Vref_in and Vin is the real video signal. The difference between the signals Vdac_in and Vref_b is an offset voltage Voffset. Sampling transistors T1 through T4 sample the input signals under the control of sampling control clock signals QC1 and QC2. The sampled inputs are applied to the input side a variable capacitance unit 251, which includes two variable input capacitances Ci1 and Ci2. The values of the capacitances Ci1 and Ci2 are set according to the states of the two control input signal bits PGA[7:6].

Feedback capacitors Cf1 and Cf2 are connected to the inverting and noninverting inputs, respectively, of the operational amplifier 249. Transistors T7 and T8 selectively connect and bypass the feedback capacitor Cf1 under the control of control signals QC2 and QC1P. Transistors T9 and T10 selectively connect and bypass the feedback capacitor Cf2 under the control of control signals QC2 and QC1P. The signal Vrefm is selectively applied to the feedback capacitors Cf1 and Cf2 under the control of transistors T5 and T6 and timing signals QC1.

The CDS samples and amplifies the input signal to provide an output signal Vout. The output signal Vout is the difference between the output signals from the operational amplifier, that is, Vout=Vcoutp−Vcoutn.

The gain of the amplifier circuit in the CDS of FIG. 8 is set by the ratio of the capacitances. Under charge conservation, the following equation results:

$$Vout=Ci/Cf(Vref\_in-Vin+Voffset)-Vref$$

The CDS of the invention therefore includes a programmable gain amplifier. The gain of the CDS is Ci/Cf, since Ci1=Ci2=Ci, and Cf1=Cf2=Cf. The input capacitors Ci are settable via the input signals bits PGA[7:6]. With the two input bits, both of the capacitors are settable to one of four possible levels. As shown in FIG. 8, if the feedback capacitances are each C, then, in one particular embodiment, the input capacitors are settable to, for example, 0.5 C, 1 C, 2 C and 4 C. Accordingly, the gain of the CDS is settable to one of four values, namely, 0.5, 1.0, 2.0 and 4.0. The sampled and amplified output signal is applied to the programmable gain amplifier PGA 220.

Figure 9:
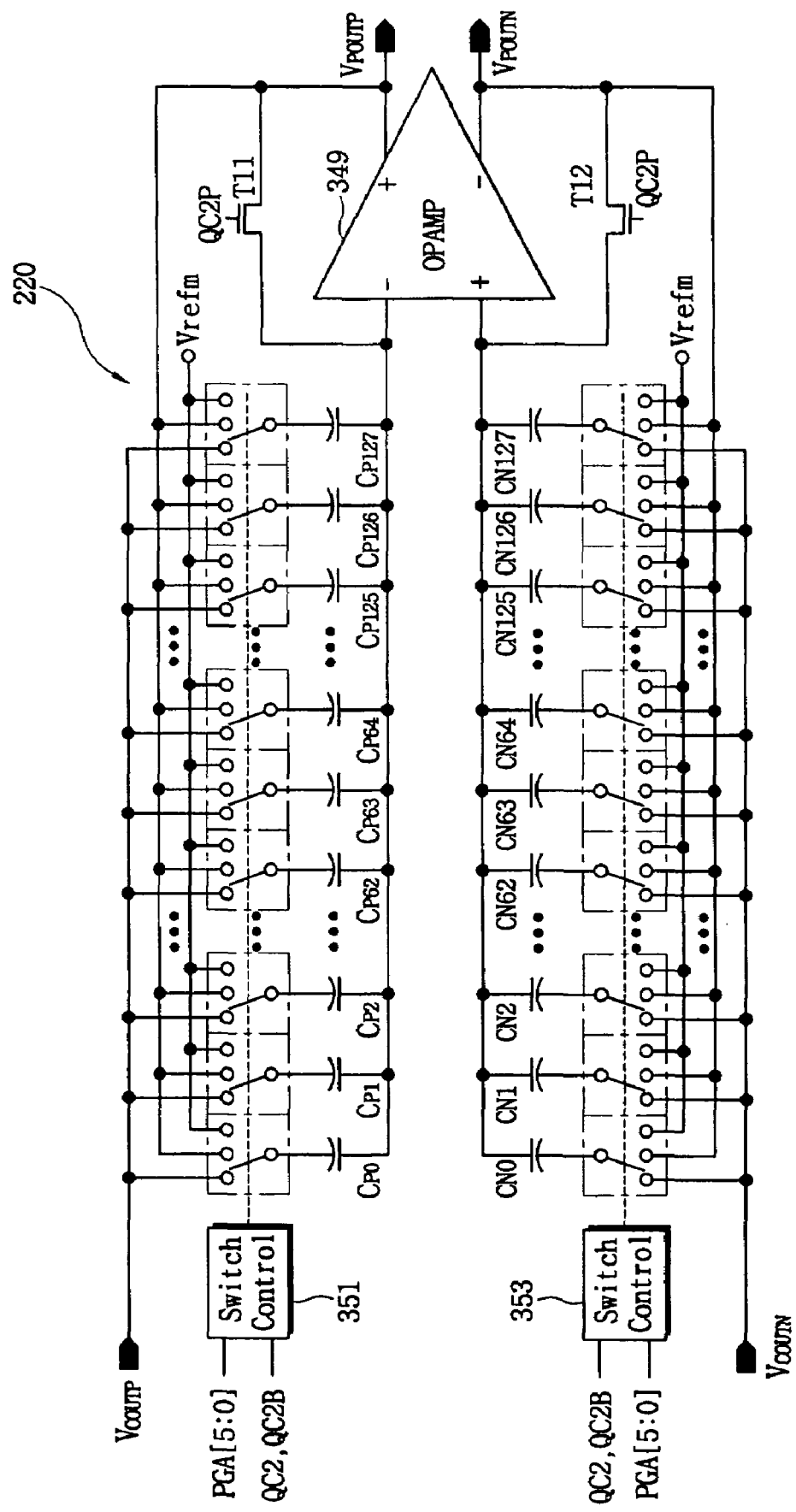
FIG. 9 is a schematic block diagram of one embodiment of a programmable gain amplifier (PGA) in accordance with the invention.

FIG. 9 is a schematic block diagram of one embodiment of a PGA 220 in accordance with the invention. The PGA 220 includes a first plurality of 128 switched capacitors Cp0 through Cp127. These capacitors are selectively connected to the inverting input of the operational amplifier 349 under the control of the first switch control 351 and a plurality of connected switches. Under the control of the remaining digital signal bits PGA[5:0], the switch control 351 determines for each capacitor Cp0 through Cp127 whether the capacitor is connected to the CDS output signal Vcoutp, the reference voltage Vrefm or the output signal Vpoutp of the operational amplifier 349. The switch control 351 also receives the control signals QC2 and QC2B and uses them in selecting the connections of the capacitors. The PGA 220 also includes a second plurality of 128 switched capacitors Cn0 through Cn127. These capacitors are selectively connected to the non-inverting input of the operational amplifier 349 under the control of the second switch control 353 and a plurality of connected switches. Under the control of the remaining digital signal bits PGA[5:0], the switch control 353 determines for each capacitor Cn0 through Cn127 whether the capacitor is connected to the CDS output signal Vcoutn, the reference voltage Vrefm or the output signal Vpoutn of the operational amplifier 349. The switch control 353 also receives the control signals QC2 and QC2B and uses them in selecting the connections of the capacitors.

Transistors T11 and T12 selectively connect and bypass the feedback capacitance under the control of the signal QC2P.

The PGA circuit of FIG. 9 operates in an input mode and an output mode.

Under charge conservation, the following results for the circuit of FIG. 9.

$$(128-y)C \times (Vpoutp-Vpoutn)=128\ C \times (Vcoutp-Vcoutn)$$

$$Vpoutp-Vpoutn=128\ C/(128-y)C \times (Vcoutp-Vcoutn)$$

$$Vout=(2^{(6+1)})/(2^{(6+1)}-y) \times Vin=(128/128-y) \times Vin$$

In the above, Cp=Cn=C; y is an integer from 1 to 64.

The gain in the PGA of FIG. 9 is given by (128)/(128−y). Therefore, with y in the range from 1 to 64, the gain of the PGA is in the range from approximately 1 to 2.

Operation of the switch controls 351 and 353 is in accordance with the following. When QC2 is logic high, QC2B is logic low. The bits PGA[5:0] are don't care states, that is, their states are irrelevant. In this state, all upper switches are controlled by the switch control 351, 353 to be connected to Vcoutp, and all lower switches are controlled to be connected to Vcoutn. As a result, the numerator in the gain expression above is 128.

Figure 11:
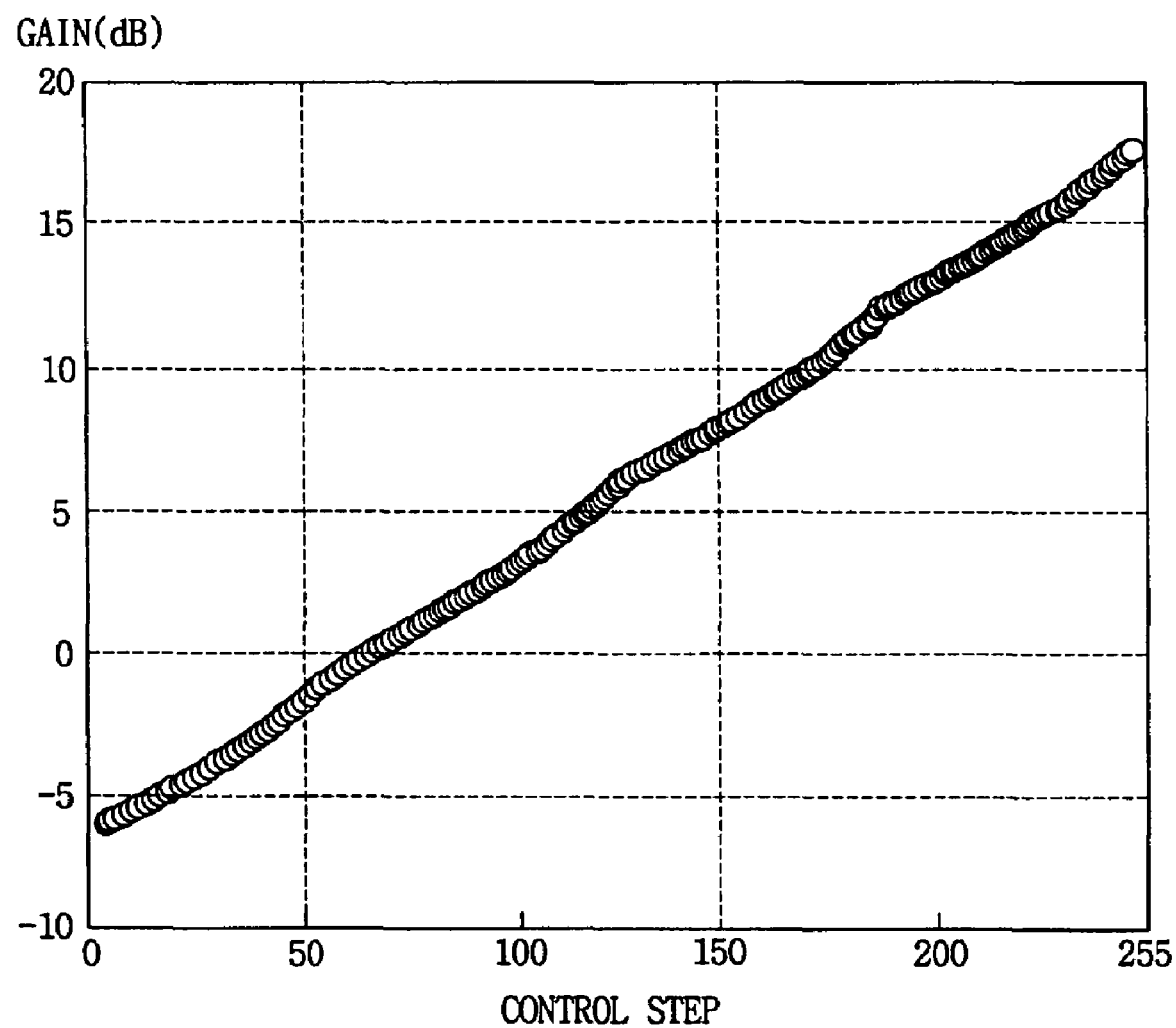
FIG. 11 is a graph of the overall gain in the system of the invention.

When QC2B is in a high logic state, QC2 is in a low logic state. The PGA[5:0] gain setting bits determine which of the switches are connected to Vrefm and which are connected to Vpoutp. This is determined by the desired gain of the PGA. For example, if the bits PGA[5:0] are 000000, one switch is connected to Vrefm and 127 switches are connected to Vpoutp. If the bits PGA[5:0] are 111111, 64 switches are connected to Vrefm and 64 switches are connected to Vpoutp. This control scheme allows the parameter y in the denominator of the gain expression above to vary from 1 to 64, thus allowing the gain of the PGA to vary from 128/127 (1.008) to 2. FIG. 10 is a table illustrating the gain in the CDS (labeled A), the gain in the PGA (labeled B), the overall DC gain (V/V)

and the overall DC gain (dB) for the gain setting values of the bits of the digital gain setting signal, i.e., PGA[7:6] and PGA [5:0]. FIG. 11 is a graph of the overall gain. In the graph, the control step is the value of the bits PGA[7:0], ranging from 0 to 255. With reference to FIG. 11, it is noted that the gain of the system of the invention is an almost perfect log scale, i.e., it is a pseudo log scale.

Figure 1:
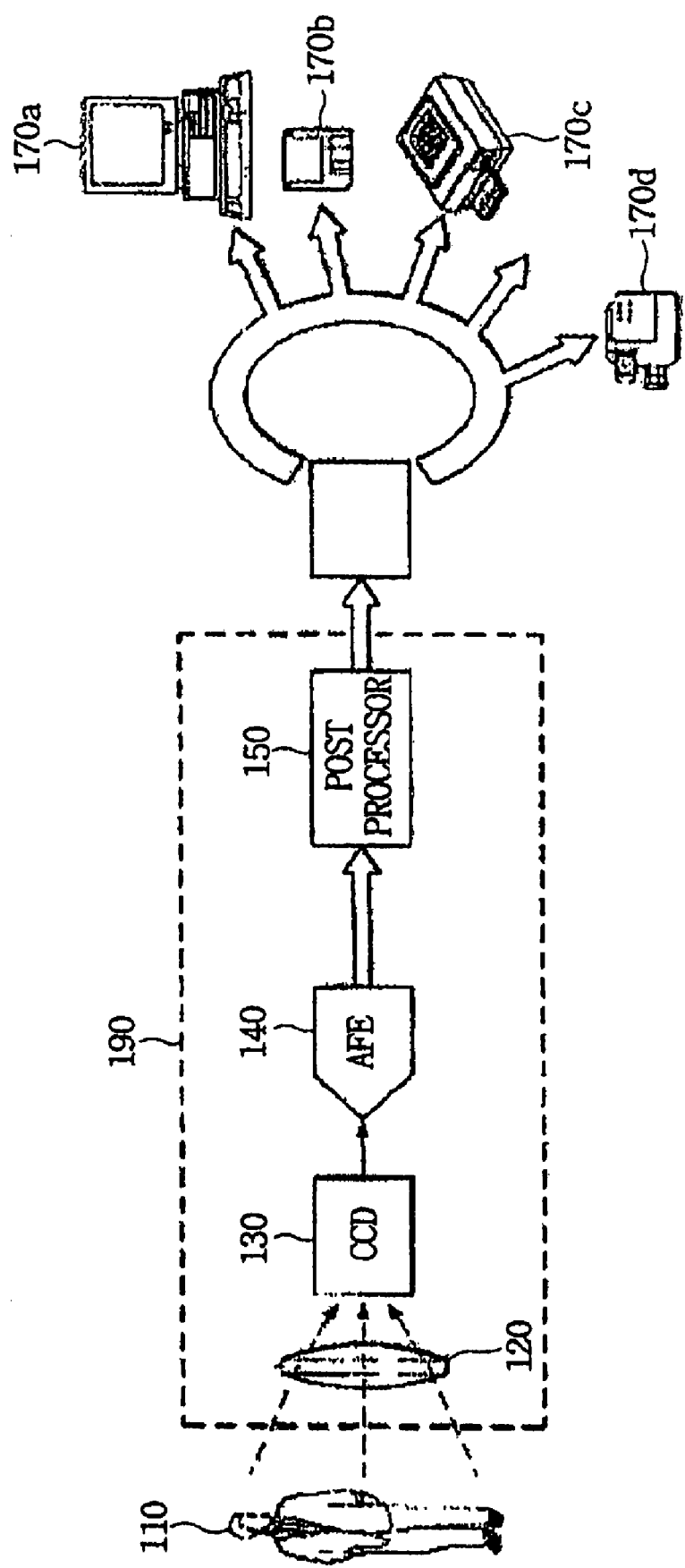
FIG. 1 contains a schematic block diagram of an image processing system.
Figure 2:
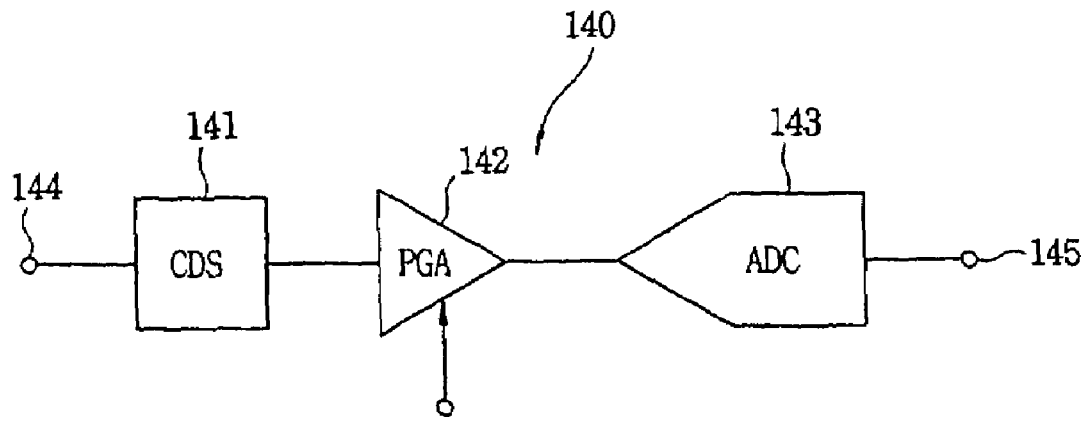
FIG. 2 is a schematic block diagram of an analog front end (AFE) in an image processing system.
Figure 3:
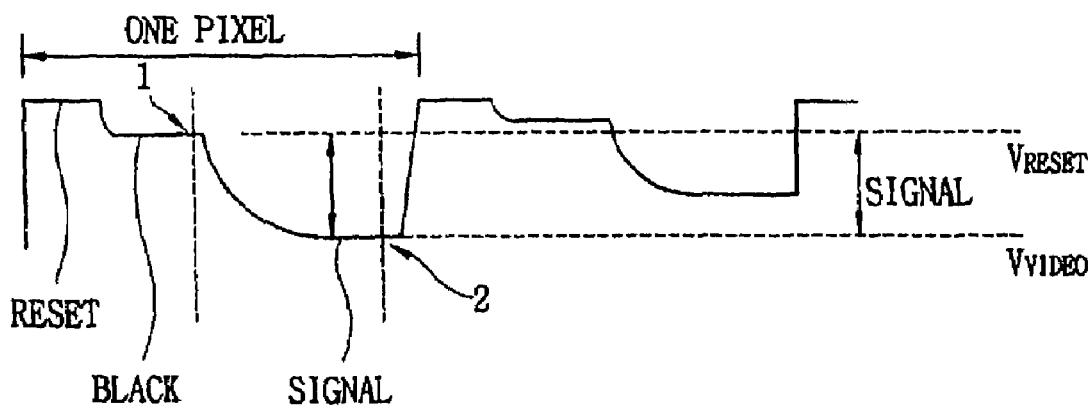
FIG. 3 is a waveform diagram illustrating a typical input analog image signal.
Figure 12:
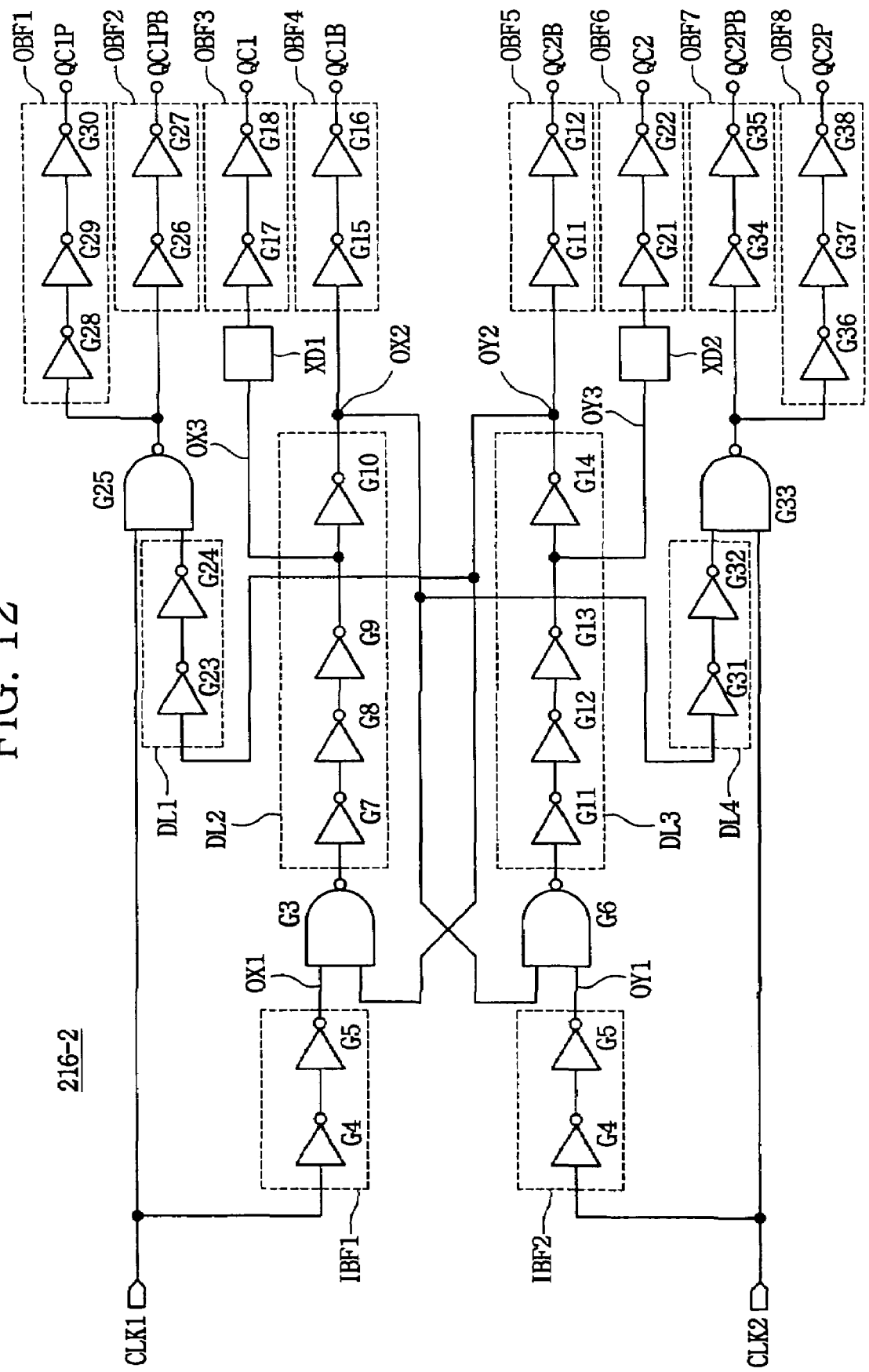
FIG. 12 is a detailed schematic block diagram of a circuit for generating timing signals in the system of the invention.
Figure 13:
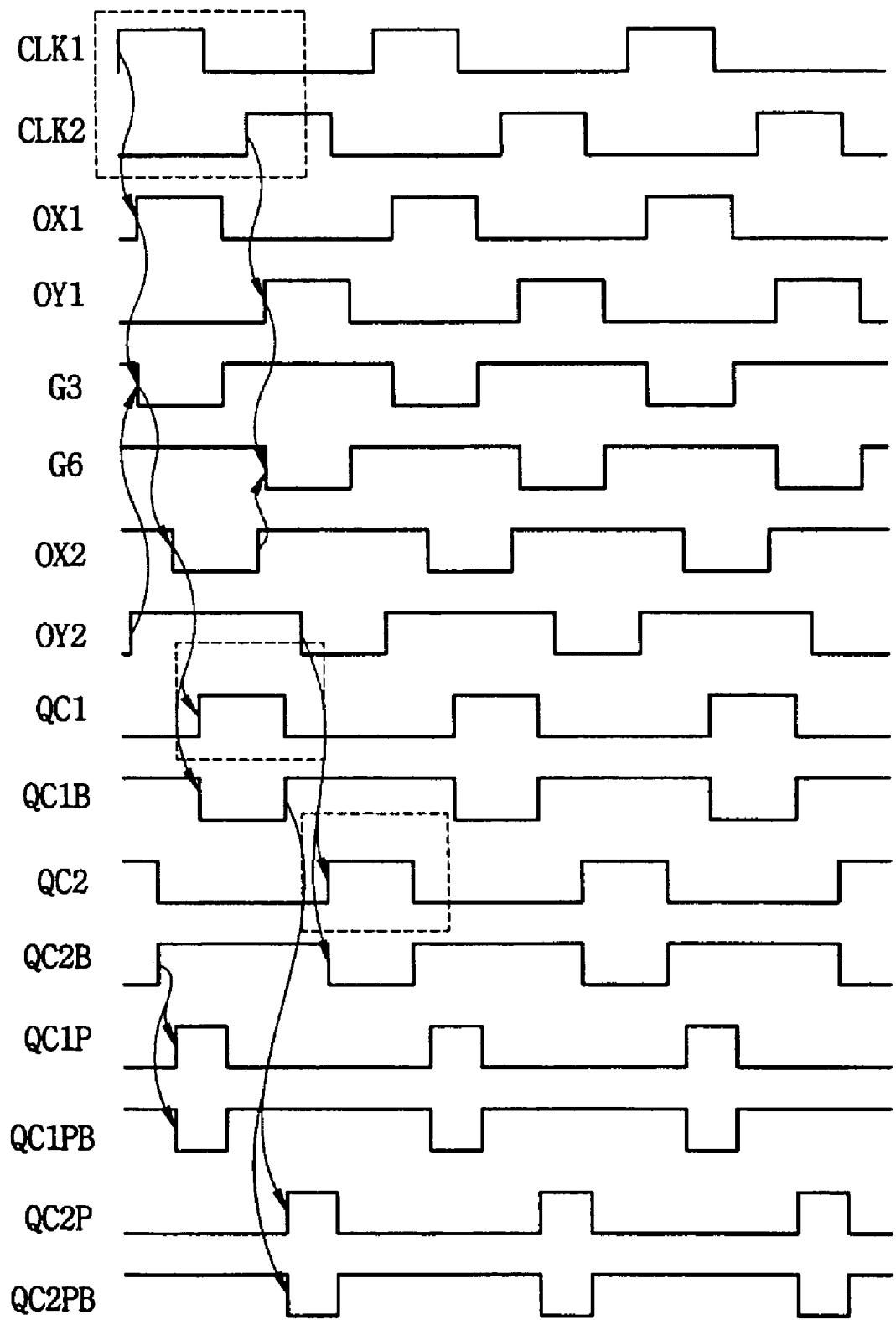
FIG. 13 is a waveform diagram illustrating timing of signals in the circuits of the invention where clock signals do not overlap.
Figure 14:
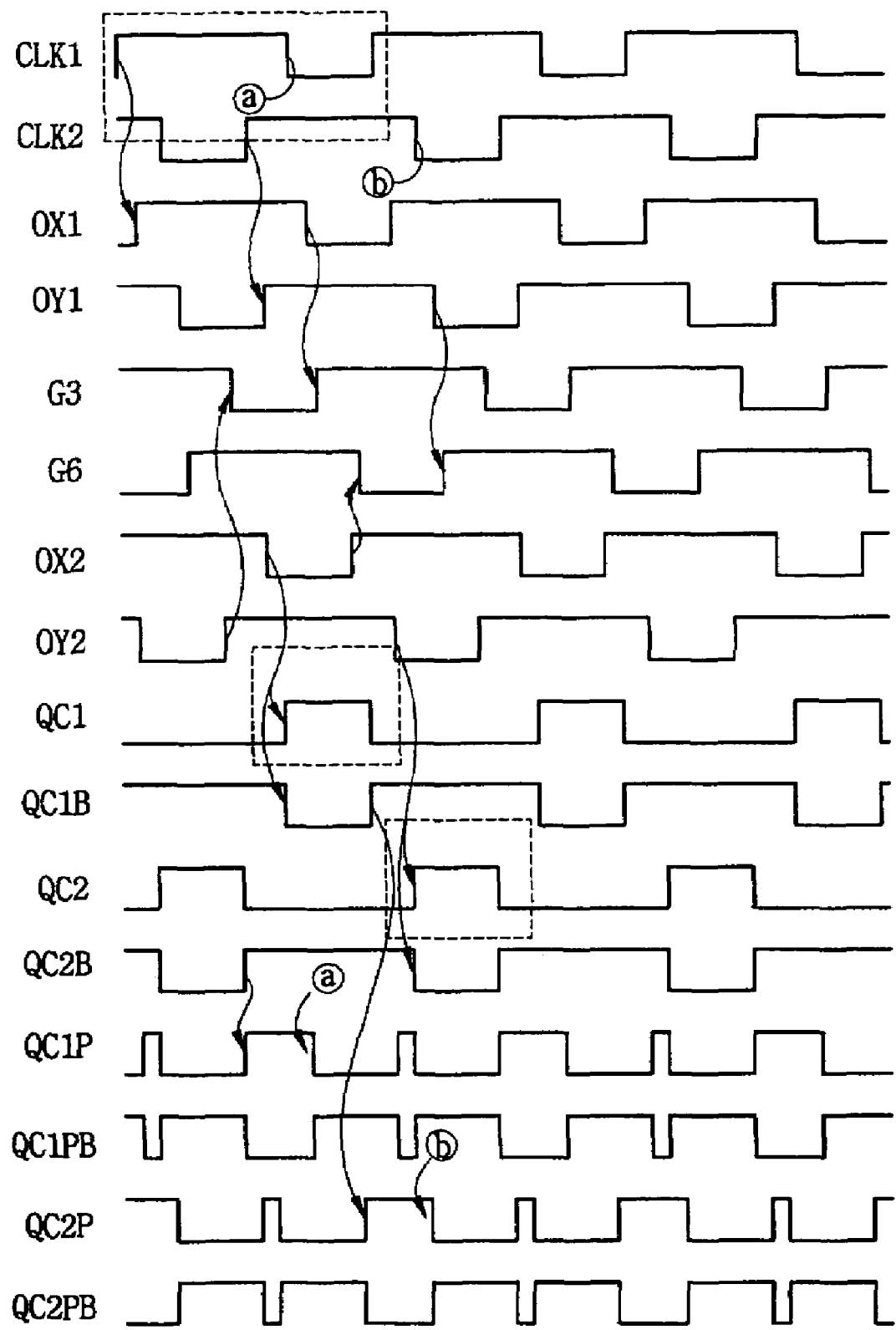
FIG. 14 is a waveform diagram illustrating timing of signals in the circuits of the invention where clock signals overlap.

FIG. 12 is a detailed schematic block diagram of a circuit for generating timing signals in the system of the invention. In the circuit of FIG. 12, two clock signals CLK1 and CLK2 are used to generate the timing signals described and illustrated herein. In general, the signal CLK1 is conventionally used to sample the input video signal in the black level interval (see FIG. 3). The signal CLK2 is used to control sampling of the video signal during the video data portion of the signal. However, with reference to FIG. 14, it is possible that the signals CLK1 and CLK2 overlap in time, causing distortion of the samples of the input signal. FIG. 14 is a waveform diagram illustrating timing of signals in the circuits of the invention where clock signals overlap. FIG. 13 is a waveform diagram illustrating timing of signals in the circuits of the invention where clock signals do not overlap.

In order to avoid the condition of overlapping clock signals, the present invention uses signals other than the signals CLK1 and CLK2 to sample the input signal. Specifically, as described above and as shown in the drawings, the system of the invention uses the signals QC1 and QC2 to control the sampling. These signals are derived from the clock signals CLK1 and CLK2 as shown in the circuit diagram of FIG. 12.

While this invention has been particularly shown and described with reference to preferred embodiments thereof, it will be understood by those skilled in the art that various changes in form and details may be made therein without departing from the spirit and scope of the invention as defined by the appended claims.

For example, throughout the foregoing description, the CDS is described has receiving two control bits to control the capacitance of input capacitors to set a gain to one of four levels. The PGA is described as having switch controls and switched capacitors. It should be noted that these amplification approaches may be reversed. That is, the CDS may use the switched capacitor approach instead of the PGA.

The invention claimed is:

1. An image processing system, comprising:
   an input for receiving an input signal;
   a correlated double sampler (CDS) for receiving the input signal, sampling the input signal, amplifying the input signal with a first gain, and providing an output signal, the CDS comprising an amplifier for amplifying the input signal with the first gain, the first gain being settable to one of a plurality of first levels based on a digital input signal; and
   a programmable gain amplifier (PGA) for receiving the output signal from the CDS and amplifying the received output signal, the PGA comprising a second amplifier for amplifying the received output signal with a second gain, the second gain being settable to one of a plurality of second levels based on the digital input signal, each of the first levels being divided into the second levels, and an overall gain of the system being determined by a combination of the first gain of the CDS and the second gain of the PGA.

2. The image processing system of claim 1, wherein the first gain in the CDS is settable to a level between 1.0 and 2.0.

3. The image processing system of claim 1, wherein the second gain in the PGA is settable to a level between 1.0 and 2.0.

4. The image processing system of claim 1, wherein the digital input signal contains a plurality of bits.

5. The image processing system of claim 4, wherein the first gain of the CDS is settable to one of the first levels based on a first portion of the bits and the second gain of the PGA is settable one of the second levels based on a second portion of the bits.

6. The image processing system of claim 1, wherein the overall gain is pseudo-logarithmic.

7. An image processing system, comprising:
   a correlated double sampler (CDS) for receiving an input signal, sampling the input signal, amplifying the input signal with a first gain, and providing a first output signal, the first gain being settable to one of a plurality of first levels based on a digital input signal; and
   a programmable gain amplifier (PGA) for receiving the first output signal from the CDS and amplifying the first output signal with a second gain, and providing a second output signal, the second gain being settable to one of a plurality of second levels based on the digital input signal, each of the first levels being divided into the second levels, and an overall gain of the system being determined by a combination of the first gain of the CDS and the second gain of the PGA.

8. The image processing system of claim 7, wherein the CDS comprises:
   a first amplifier for amplifying the input signal;
   a first capacitor unit having a first variable capacitance, and coupled to a first input of the first amplifier; and
   a second capacitor unit having a second variable capacitance, and coupled to a second input of the second amplifier.

9. The image processing system of claim 8, wherein the first gain in the CDS is settable to a level between 1.0 and 2.0.

10. The image processing system of claim 9, wherein the PGA comprises:
    a second amplifier for amplifying the first output signal:
    a first plurality of switched capacitors having a third variable capacitance, and coupled to a first output terminal of the first amplifier and a first input terminal of the second amplifier; and
    a second plurality of switched capacitors having a fourth variable capacitance, and coupled to second output terminal of the first amplifier and a second input terminal of the second amplifier.

11. The image processing system of claim 10, wherein the second gain in the PGA is settable to a level between 1.0 and 2.0.

12. The image processing system of claim 11, wherein the first gain is settable to one of the first levels by adjusting the first variable capacitance and the second variable capacitance based on the digital input signal, and the second gain is settable to one of the second levels by adjusting the third variable capacitance and the fourth variable capacitance based on the digital input signal.

13. The image processing system of claim 12, wherein the digital input signal contains a plurality of bits.

14. The image processing system of claim 13, wherein the first gain in the CDS is settable to one of the first levels based on a first portion of the bits and the second gain in the PGA is settable to one of the second levels based on the second portion of the bits.

15. The image processing system of claim 7, wherein the CDS comprises:
    the first amplifier having an inverted input terminal, a non-inverted input terminal, an inverted output terminal, and a non-inverted output terminal;
    a first capacitor unit coupled between the inverted input terminal and a first node, a first capacitance of the first capacitor unit varying in response to a first portion of a plurality of bits of the digital input signal a first sampling switch for sampling a reference level signal of the input signal in response to a first sampling clock to output a sampled reference level signal to the first node;

a second sampling switch for sampling an image signal of the input signal in response to a second sampling clock to output a sampled image signal to the first node;

a second capacitor unit coupled between the inverted input terminal and the non-inverted output terminal, a second capacitance of the second capacitor unit having a unit capacitance value;

a third sampling switch serially coupled to the second capacitor unit to be turned on in response to the second sampling clock;

a third capacitor unit coupled between the non-inverted input terminal and a second node, a third capacitance of the capacitor unit varying in response to the first portion of a plurality of bits of the digital input signal;

a fourth sampling switch for sampling a first reference level signal in response to the first sampling clock to output a sampled first reference level signal to the second node;

a fifth sampling switch for sampling a feedback signal in response to the second sampling clock to output a sampled feedback signal to the second node;

a fourth capacitor unit coupled between the non-inverted input terminal and the inverted output terminal, a fourth capacitance of the second capacitor unit having the unit capacitance value; and a sixth sampling switch serially coupled to the fourth capacitor unit to be turned on in response to the second sampling clock.

16. The image processing system of claim 15, wherein active periods of the second sampling clock do not overlap with active periods of the first sampling clock.

17. The image processing system of claim 15, wherein the first reference level signal has a first level, the second reference level has a second level, and the third reference level has a third level, the first level being lower than the second level, and the second level being lower than the third level.

18. The image processing system of claim 7, wherein the overall gain is pseudo-logarithmic.

19. The image processing system of claim 7, wherein the PGA comprises:

a second amplifier having an inverted input terminal, a non-inverted input terminal, an inverted output terminal, and a non-inverted output terminal;

a first switch array having a first plurality of switches, each of the first switches having a first terminal, a second terminal, and a third terminal, the first terminal coupled to a non-inverting output terminal of the first operational amplifier, the second terminal coupled to the non-inverting output terminal of the second operational amplifier, the third terminal receiving one of the first, second, and third reference level signals, each of the first switches switching the first, second, and third terminals to a first common terminal in response to the second sampling clock and a second portion of a plurality of bits of the digital input signal;

a first plurality of capacitors respectfully coupled to the inverted input terminal of the second operational amplifier and first common terminals of the first switch array;

a second switch array having a second plurality of switches, each of the second switches having a fourth terminal, a fifth terminal, and a sixth terminal, the fourth terminal coupled to an inverting output signal of the first operational amplifier, the fifth terminal coupled to the non-inverting output terminal of the second operational amplifier, the sixth terminal receiving one of the first, second, and third reference level signals, each of the second switches switching the fourth, fifth, and sixth terminals to a second common terminal in response to the second sampling clock and the second portion of the plurality of bits of the digital input signal; and a second plurality of capacitors respectively coupled to the non-inverted input terminal of the second operational amplifier and second common terminals of the second switch array.

20. The image processing system of claim 19, wherein the first and second sampling clocks are generated from an overlap prevention circuit, and the overlap prevention circuit includes:

a first input buffer for buffering a first clock;

a second input buffer for buffering a second clock to output a fourth clock;

a first logic circuit for performing a first logic operation on an output signal of the first input buffer and a first feedback signal;

a second logic circuit for performing a second logic operation on an output signal of the second input buffer and a second feedback signal;

a first delay circuit for delaying an output signal of the first logic circuit to generate the second feedback signal;

a second delay circuit for delaying an output signal of the second logic circuit to generate the first feedback signal;

a first output buffer for buffering the second feedback signal to generate the first sampling clock; and a second output buffer for buffering the first feedback signal to generating the second sampling clock.

21. The image processing system of claim 19, wherein the first sampling clock has an inverted phase with respect to the second feedback signal, and the second sampling clock has an inverted phase with respect to the first feedback signal.

22. A method of processing an image, comprising:

providing a correlated double sampler (CDS) for receiving an input signal, sampling the input signal, amplifying the input signal with a first gain of the CDS, providing an output signal, and setting the first gain to one of a plurality of first levels based on a digital input signal;

providing a programmable gain amplifier (PGA) for receiving the output signal from the CDS and amplifying the received output signal with a second gain of the PGA; and setting the second gain to one of a plurality of second levels based on the digital input signal, each of the first levels being divided into the second levels, and an overall gain being determined by a combination of the first gain of the CDS and the second gain of the PGA.

23. The method of claim 22, wherein setting the first gain comprises setting the first gain to a level between 1.0 and 2.0.

24. The method of claim 22, wherein setting the second gain comprises setting the second gain to a level between 1.0 and 2.0.

25. The method of claim 22, wherein the digital input signal contains a plurality of bits.

26. The method of claim 25, wherein the first gain of the CDS is settable to one of the first levels based on a first portion of the bits and a second gain of the PGA is settable to one of the second levels based on a second portion of the bits.

27. The method of claim 22, wherein the overall gain is pseudo-logarithmic.

* * * * *